(12) United States Patent
Biwa et al.

(10) Patent No.: US 7,227,189 B2
(45) Date of Patent: Jun. 5, 2007

(54) VAPOR-PHASE GROWTH METHOD FOR A NITRIDE SEMICONDUCTOR AND A NITRIDE SEMICONDUCTOR DEVICE

(75) Inventors: Goshi Biwa, Kanagawa (JP); Hiroyuki Okuyama, Kanagawa (JP); Masato Doi, Kanagawa (JP); Toyoharu Oohata, Kanagawa (JP)

(73) Assignee: Sony Corporation, Tokyo (JP)

( * ) Notice: Subject to any disclaimer, the term of this patent is extended or adjusted under 35 U.S.C. 154(b) by 36 days.

(21) Appl. No.: 10/868,313

(22) Filed: Jun. 15, 2004

(65) Prior Publication Data

US 2004/0227152 A1    Nov. 18, 2004

Related U.S. Application Data

(62) Division of application No. 10/126,240, filed on Apr. 18, 2002, now Pat. No. 6,818,463.

(30) Foreign Application Priority Data

Apr. 19, 2001    (JP) .......................... P2001-120615

(51) Int. Cl.
*H01L 33/00*    (2006.01)
(52) U.S. Cl. .................. 257/76; 257/103; 117/106
(58) Field of Classification Search ................. 257/76, 257/78, 103, 200, 201, 431; 117/97, 106, 117/952
See application file for complete search history.

(56) References Cited

U.S. PATENT DOCUMENTS 5,239,188 A * 8/1993 Takeuchi et al. .............. 257/76

| | | | | |
|---|---|---|---|---|
| 5,981,977 A * | 11/1999 | Furukawa et al. | ............ | 257/94 |
| 6,091,085 A * | 7/2000 | Lester | ............ | 257/98 |
| 6,153,010 A * | 11/2000 | Kiyoku et al. | ............ | 117/95 |
| 6,325,850 B1 | 12/2001 | Beaumont et al. | | |
| 2001/0031385 A1 | 10/2001 | Hiramatsu et al. | | |
| 2002/0115267 A1 | 8/2002 | Tomiya et al. | | |
| 2002/0137249 A1 | 9/2002 | Ishida et al. | | |

FOREIGN PATENT DOCUMENTS

| JP | 63-188938 | 8/1988 |
|---|---|---|
| JP | 08-008217 | 12/1996 |
| JP | 10-312971 | 11/1998 |
| JP | 11-23687 | 8/1999 |
| JP | 11-251253 | 9/1999 |
| JP | 2000-012976 | 1/2000 |

OTHER PUBLICATIONS

Kapolnek et al., Appl. Phys. Lett. 71, (9), Sep. 1, 1997, pp. 1204-1206.*
Mrs. Internet J. Nitride Semicond. Res. 4S1, G3.38 (1999).

* cited by examiner

*Primary Examiner*—Thomas L. Dickey
(74) *Attorney, Agent, or Firm*—Bell, Boyd & Lloyd LLP

(57) ABSTRACT

Nitride semiconductor devices and methods of producing same are provided. The present invention includes forming a nitride semiconductor layer on a base body of the nitride semiconductor under selective and controlled crystal growth conditions. For example, the crystal growth rate, the supply of crystal growth source material and/or the crystal growth area can be varied over time, thus resulting in a nitride semiconductor device with enhanced properties.

8 Claims, 6 Drawing Sheets

VAPOR-PHASE GROWTH METHOD FOR A NITRIDE SEMICONDUCTOR AND A NITRIDE SEMICONDUCTOR DEVICE

CROSS REFERENCES TO RELATED APPLICATIONS

This patent application is a divisional of U.S. application Ser. No. 10/126,240 now U.S. Pat. No. 6,818,463 filed on Apr. 18, 2002, the disclosure of which is herein incorporated by reference.

RELATED APPLICATION DATA

The present invention claims priority to Japanese Patent Document No. P2001-120615 filed on Apr. 19, 2001 herein incorporated by reference to the extent permitted by law.

BACKGROUND OF THE INVENTION

The present invention relates to a vapor-phase growth method for a nitride semiconductor, which can be adapted to form a nitride semiconductor, such as a gallium nitride based compound semiconductor, on a base body by vapor-phase growth, and to a nitride semiconductor device, such as a nitride semiconductor light emitting diode, a nitride semiconductor laser, a suitable nitride semiconductor electron device formed by using the vapor-phase growth method or the like. More specifically, the present invention relates to a vapor-phase growth method for a nitride semiconductor, which can be adapted to form an anti-surfactant film on a base body and form a nitride semiconductor layer by crystal growth from an opening portion formed in the anti-surfactant film, and a nitride semiconductor device formed by using the vapor-phase growth method.

In recent years, nitride based III–V compound semiconductors, such as GaN, AlGaN and GaInN, have become a focus of attention. This is because such a semiconductor has a forbidden band width ranging from 1.8 eV to 6.2 eV, and therefore, the semiconductor theoretically allows realization of a light emitting device enabling emission of light ranging from red light to ultraviolet light.

In the case of fabricating a light emitting diode (LED) or a semiconductor laser by using a nitride based III–V compound semiconductor, it is required to form a structure in which multi-layers, such as a GaN layer, an AlGaN layer, a GaInN layer, and the like, are stacked such that a light emitting layer (active layer) is sandwiched between an n-type cladding layer and a p-type cladding layer. In some cases, such a light emitting diode or a semiconductor laser includes a light emitting layer having a quantum well structure composed of GaInN/GaN or GaInN/AlGaN.

A vapor-phase growth technique for a nitride semiconductor, such as a gallium nitride based compound semiconductor, can be problematic because it can be difficult to obtain a substrate that is lattice matched with a nitride semiconductor or a substrate having a low density of dislocations. To solve such a problem, there is known a technique of depositing a low temperature buffer layer made from AlN or $Al_xGa_{1-x}N$ ($0 \leq x < 1$) at a low temperature of 900° C. or less on a surface of a substrate made from sapphire or the like, and then growing a gallium nitride based compound semiconductor thereon, thereby reducing dislocations due to lattice mismatching between the substrate and the compound semiconductor. Such a technique has been disclosed, for example, in Japanese Patent Laid-open No. Sho 63-188938 and Japanese Patent Publication No. Hei 8-8217. By using such a technique, it is possible to obtain a gallium nitride based compound semiconductor with improved crystallinity and morphology.

Another technique of obtaining a high quality crystal structure at a low density of dislocations has been disclosed, for example, in Japanese Patent Laid-open Nos. Hei 10-312971 and Hei 11-251253. This method involves depositing a first gallium nitride based compound semiconductor layer, forming a protective film made from a material capable of inhibiting growth of a gallium nitride based compound semiconductor, such as silicon oxide or silicon nitride, in such a manner as to selectively cover the first gallium nitride based compound semiconductor, and growing a second gallium nitride based compound semiconductor in an in-plane direction (lateral direction) from regions, not covered with the protective film, of the first gallium nitride based compound nitride layer, thereby preventing propagation of through-dislocations extending in the direction perpendicular to the interface of the substrate.

A further technique of reducing a density of through-dislocations has been disclosed, for example, in a document (MRS Internet J. Nitride Semicond. Res. 4S1, G3. 38 (1999)). This method involves growing a first gallium nitride based compound semiconductor, selectively removing the thus formed semiconductor film by using a reactive ion etching (hereinafter, referred to as "RIE") system, and selectively growing a second gallium nitride based compound semiconductor from the remaining crystal in the growth apparatus. According to this method, it is possible to obtain a crystal film having a density of dislocations, which is reduced to about $10^6/cm^2$, and hence to realize a high life semiconductor laser using the crystal film formed according to this method.

By the way, in the case of growing a gallium nitride based compound semiconductor layer by such a selective growth technique, a selective growth portion has a three-dimensional structure called "facet" having a tilt plane which is a stable plane growing at a low crystal growth. For example, in the case of forming an underlying layer on a sapphire substrate with a C-plane of sapphire taken as a principal plane of the substrate, covering the surface of the underlying layer with a silicon oxide film as an anti-surfactant film (growth-inhibiting film), and selectively growing a gallium nitride layer from an opening portion provided in the silicon oxide film by supplying a source gas, crystal growth portion has a pyramid shape, for example, a hexagonal pyramid shape having a tilt plane covered with a crystal plane, such as an S-plane.

In this case, however, since a crystal growth rate is generally low at the tilt plane, a supplied source of a group III element is not deposited but migrated at the tilt plane. On the contrary, at a top portion of the pyramid shaped crystal growth layer, since the supplied amount of the source becomes excessively large, the crystal growth rate becomes significantly high. As a result, the top portion of the crystal growth layer contains a number of defects such as point defects, that is, has poor crystallinity. Further, crystal growth at the top portion of the crystal growth layer does not result in a smooth surface, and accordingly, in the case of fabricating a semiconductor device having an active layer or a pn-function particularly on the top portion, performances of the semiconductor device are significantly degraded.

A need, therefore, exists to provide improved nitride semiconductors that can be readily made and effectively used in a variety of applications.

SUMMARY OF THE INVENTION

An advantage of the present invention is to provide a vapor-phase growth method for a nitride semiconductor, which does not cause an excessive supply of a source at a top portion of a crystal growth layer formed by selective growth, thereby fabricating a nitride semiconductor device excellent in characteristics, such as a light emission characteristic.

Another advantage of the present invention is to provide an improved nitride semiconductor device fabricated by a vapor-phase growth method according to an embodiment of the present invention.

In an embodiment, the present invention provides a method of vapor-phase growth of a nitride semiconductor including the steps of supplying a first amount of a source material to a base body of the nitride semiconductor during a first time period; selectively growing a first portion of a nitride semiconductor layer on the base body during the first time period wherein the first portion is grown over a first area along a plane that is substantially parallel to a principle plane of the base body; supplying a second amount of the source material to the base body during a second time period; selectively growing a second portion of the nitride semiconductor layer on the base body during the second time period wherein the second portion is grown over a second area along the plane that is substantially parallel to the principle plane; and forming the nitride semiconductor wherein the second area of the selectively grown nitride layer is equal to or less than the first area of the selectively grown nitride layer and wherein the second amount of the source material is equal to or less than the first amount of the source material.

In another embodiment, the present invention provides a nitride semiconductor device a nitride semiconductor layer having a first portion and a second portion formed on a base body by selective growth wherein the first portion is selectively grown with a first amount of source material over a first area along a plane substantially parallel to a principal plane of the base body during a first time period, wherein the second portion is selectively grown with a second amount of source material over a second area along the plane substantially parallel to the principal plane during a second time period, and wherein the second area is equal to or less than the first area and the second amount of source material is equal to or less than the first amount of source material.

In yet another embodiment of the present invention, a method of vapor-phase growth of a nitride semiconductor is provided that includes the steps of selectively growing a first portion of a nitride semiconductor layer on a base body of the nitride semiconductor during a first time period at a first growth rate wherein the first portion is grown over a first area along a plane that is substantially parallel to a principle plane of the base body; selectively growing a second portion of the nitride semiconductor layer on the base body during a second time period at a second growth rate wherein the second portion is grown over a second area along the plane that is substantially parallel to the principle plane; and forming the nitride semiconductor wherein the second area of the selectively grown nitride layer is equal to or less than the first area of the selectively grown nitride layer and wherein the second growth rate is equal to or less than the first growth rate.

In still yet another embodiment, a nitride semiconductor device is provided that includes a nitride semiconductor layer having a first portion and a second portion formed on a base body by selective growth wherein the first portion is selectively grown at a first growth rate over a first area along a plane substantially parallel to a principal plane of the base body during a first time period, wherein the second portion is selectively grown at a second growth rate over a second area along the plane substantially parallel to the principal plane during a second time period, and wherein the second area is equal to or less than the first area and the second growth rate is equal to or less than the first growth rate.

In an further embodiment of the present invention, a method of vapor-phase growth for a nitride semiconductor is provided. The method includes forming a base body of the nitride semiconductor wherein the base body has a principal plane; and selectively growing a nitride semiconductor layer containing indium on the base body at a crystal growth rate ranging from about 1 µm/h or less wherein the nitride semiconductor layer is grown along a plane that is perpendicular to a principal plane of the base body.

According to an embodiment of the present invention, there is provided a vapor-phase growth method for a nitride semiconductor, including the step of forming a nitride semiconductor layer on a base body by selective growth wherein an area of a plane, being nearly in parallel to a principal plane of the base body, of the nitride semiconductor layer grown by selective growth varies with respect to time $S(t)$ (t: time), where an area $S(t2)$ of the nitride semiconductor layer at a time $t2$ is equal to or smaller than an area $S(t1)$ of the nitride semiconductor layer at a time $t1$ before the time $t2$, and a source supplied in amount $X2$ at the time $t2$ is equal to or smaller than a source supplied in amount $X1$ at the time $t1$.

In an embodiment, the nitride semiconductor layer can be a mixed crystal containing indium, or a mixed crystal layer containing indium can be grown on the nitride semiconductor layer which has been formed by selective growth. The vapor-phase growth method of the present invention can further include, in an embodiment, the step of forming an active layer on the plane, being nearly in parallel to the principal plane of the base body, of the nitride semiconductor layer, or forming an active layer on a tilt or slanted plane, being not in parallel to the principal plane of the base body, of the nitride semiconductor layer. The base body may be a gallium nitride based compound semiconductor substrate or a gallium nitride based compound semiconductor layer grown on a substrate made from a material different from a gallium nitride based compound semiconductor.

In selective growth, since an area of the nitride semiconductor layer grown over time tends to become small, the supply of a source to the opening portion tends to become large in proportion to an inverse of an opening ratio of a mask. In this case, since a side plane of the crystal growth layer is stable, the supply of the source of a group III element tends to become excessively large at the top portion. This can be prevented by adjusting the amount of source material supplied, depending on an area of the nitride semiconductor layer, particularly, the area of the top portion thereof according to an embodiment of the present invention. As a result, it is possible to improve the crystallinity and flatness or smoothness of the top portion of the nitride semiconductor layer.

According to another embodiment of the present invention, there is provided a vapor-phase growth method for a nitride semiconductor, including the step of forming a nitride semiconductor layer on a base body by selective growth; wherein an area of a plane, being nearly in parallel to a principal plane of the base body, of the nitride semiconductor layer grown by selective growth can vary with respect to time $S(t)$ (t: time), where an area $S(t2)$ of the nitride semiconductor layer at a time $t2$ is equal to or smaller than an area S(t1) of the nitride semiconductor layer at a time t1 before the time t2, and a crystal growth rate (V2) at the time t2 is equal to or smaller than a crystal growth rate (V1) at the time t1.

This method has an effect similar to that of the previously described vapor-phase growth method for a nitride semiconductor according to an embodiment. That is to say, in selective growth, an area of the nitride semiconductor layer grown over time tends to become small, and in this case, since a side plane of the crystal growth layer is stable, the crystal growth rate becomes significantly high as nearing the top portion of the nitride semiconductor layer, with a result that the top portion of the nitride semiconductor layer tends to contain a number of point defects. This can be prevented by adjusting the growth rate depending on an area of the top portion of the nitride semiconductor layer according to an embodiment of the present invention. As a result, it is possible to improve the crystallinity and flatness or smoothness, thereby effectively eliminates pitting on the top portion of the nitride semiconductor layer.

According to yet another embodiment of the present invention, there is provided a nitride semiconductor device including a nitride semiconductor layer formed on a base body by selective growth wherein an area of a plane, being nearly in parallel to a principal plane of the base body, of the nitride semiconductor layer grown by selective growth can vary with respect to time S(t) (t: time), where an area S(t2) of the nitride semiconductor layer at a time t2 is equal to or smaller than an area S(t1) of the nitride semiconductor layer at a time t1 before the time t2, and a source supplied amount X2 or a crystal growth rate V2 at the time t2 is equal to or smaller than a source supplied amount X1 or a crystal growth rate V1 at the time t1.

The nitride semiconductor device of the present invention can have a structure of a light emitting device, an electron device, or the like. The nitride semiconductor layer can be an active layer or an active layer may be grown on the nitride semiconductor layer which has been formed by selective growth. An active layer can be provided on the plane, being substantially parallel to the principal plane of the base body, of the nitride semiconductor layer, or provided on a tilt plane, being not in parallel to the principal plane of the base body, of the nitride semiconductor layer. The base body can be a gallium nitride based compound semiconductor substrate or a gallium nitride based compound semiconductor layer grown on a substrate made from a material different from a gallium nitride based compound semiconductor.

With the nitride semiconductor device, according to an embodiment of the present invention, the crystallinity and flatness of the top portion of a nitride semiconductor layer can be improved by adjusting the source supplied amount or crystal growth rate depending on the area of the nitride semiconductor layer, which is being selectively grown, particularly, the top portion thereof. The present invention can be widely applied to fabrication of a semiconductor device using selective growth. In particular, the present invention is useful for fabrication of a light emitting device, an electron device or other suitable device having a three-dimensional structure formed by selective growth. Further, since the flat nitride semiconductor layer with fewer defects can be formed, it may be preferably applied to an active layer or a layer on which an active layer is to be formed thereon.

Additional features and advantages of the present invention are described in, and will be apparent from, the following Detailed Description of the Invention and the Figures.

DETAILED DESCRIPTION OF THE INVENTION

Figure 1:
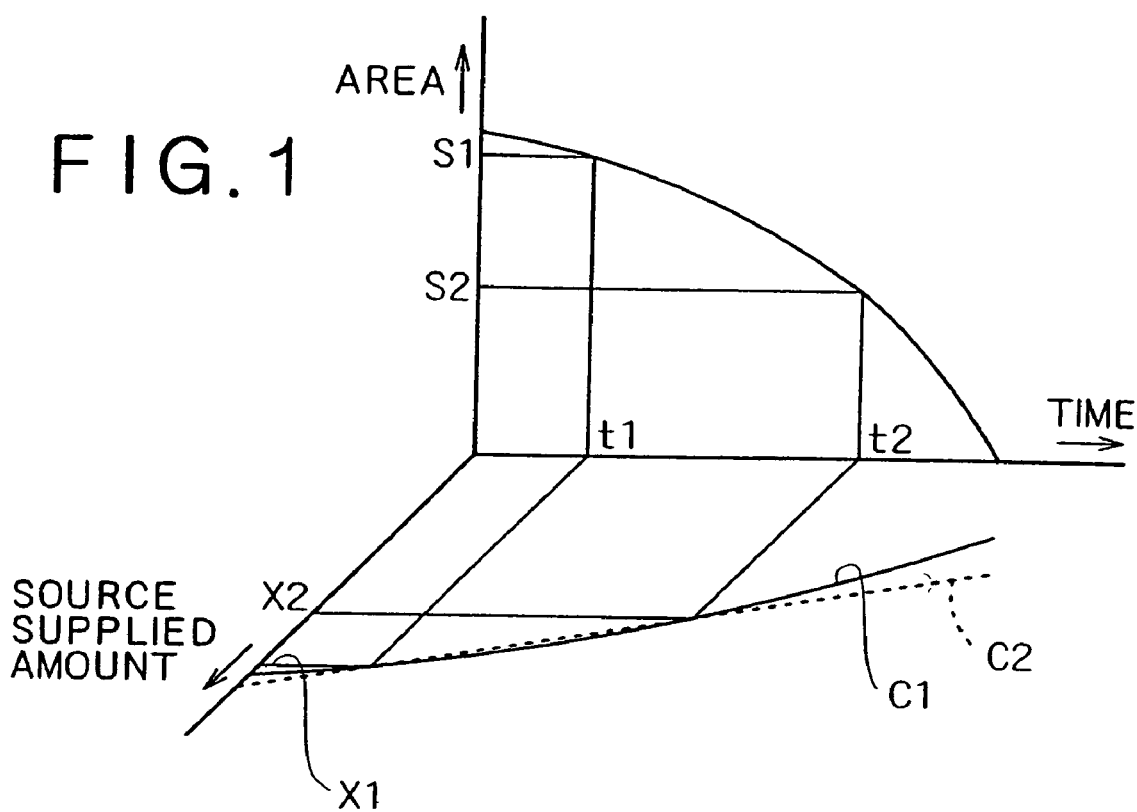
FIG. 1 is a graph showing a relationship among a time t, an area S of a nitride semiconductor layer, and a source supplied amount X to be controlled, wherein the nitride semiconductor layer is formed by selective growth by a vapor-phase growth method for a nitride semiconductor according to an embodiment of the present invention.

The present invention relates to improved nitride semiconductor devices and methods of producing same. In this regard, the present invention includes forming a nitride semiconductor layer on a base body of the nitride semiconductor under selective and controlled crystal growth conditions, thus resulting in a nitride semiconductor device with enhanced properties. For example, the crystal growth rate, the supply of crystal growth source material, the crystal growth area and/or other like and suitable conditions can be varied over time as described in detail below.

A vapor-phase growth method for a nitride semiconductor according to an embodiment of the present invention includes the step of forming a nitride semiconductor layer on a base body by selective growth, wherein an area of a plane, being nearly in parallel to a principal plane of the base body, of the nitride semiconductor layer grown by selective growth can vary with respect to time($S(t)$ where t is time) $S(t)$ (t: time), an area $S(t2)$ of the nitride semiconductor layer at a time t2 is equal to or smaller than an area $S(t1)$ of the nitride semiconductor layer at a time t1 before the time t2, and a source supplied amount X2 or a crystal growth rate V2 at the time t2 is equal to or smaller than a source supplied amount X1 or a crystal growth rate V1 at the time t1.

First, selective growth as a prerequisite for the vapor-phase growth method for a nitride semiconductor of the present invention will be described. The selective growth is performed by forming an anti-surfactant film having an opening portion on a base body, putting the base body thus provided with the anti-surfactant film in a reaction chamber, and supplying a desired carrier gas and a desired source gas, thereby forming a nitride semiconductor layer by selective growth from the opening portion without depositing a nitride semiconductor layer on the anti-surfactant film. The selective growth method is not limited to the method using an anti-surfactant mask having an opening portion but may be a method of using, as a base body, a substrate or a substrate on which an underlying layer is formed, and selectively removing part of the underlying growth layer or the substrate.

In an embodiment, the base body includes a nitride semiconductor substrate, such as a gallium nitride based compound semiconductor substrate, or a sapphire substrate on which a nitride semiconductor layer is grown. In the latter case of using, as a base body, a substrate on which a nitride semiconductor layer is grown, the substrate may be a substrate made from sapphire (i.e., $Al_2O_3$, a desirable crystal plane of which is an A-plane, R-plane, or C-plane), SiC (a desirable structure of which is 6H, 4H or 3C), GaN, Si, ZnS, ZnO, AlN, LiMgO, $LiGaO_2$, GaAs, $MgAl_2O_4$, or InAlGaN. Such a material for forming the base body preferably has a hexagonal or cubic system, and more preferably, has the hexagonal system. For example, in the case of using a sapphire substrate, a sapphire substrate with the C-plane of sapphire taken as a principal plane thereof, which has been often used for growing a gallium nitride (GaN) based compound semiconductor thereon, is preferably used. It is to be noted that the C-plane of sapphire taken as the principal plane of the substrate used herein may include a plane tilted from the strict C-plane by an angle ranging from 5° to 6°.

In the case of using, as a base body, a substrate on which a nitride semiconductor layer is formed, it is preferable to form an underlying growth layer on the substrate before the nitride semiconductor layer is formed on the substrate. The underlying growth layer may be a gallium nitride layer or an aluminum nitride layer, and may have a structure composed of a combination of a low temperature buffer layer and a high temperature buffer layer or a combination of a buffer layer and a crystal seed layer functioning as a crystal seed. The underlying growth layer may be formed by one of a variety of vapor-phase growth processes, examples of which may include a metal organic chemical vapor deposition (MOCVD) process, a molecular beam epitaxial growth (MBE) process, a hydride vapor phase epitaxial growth (HVPE) process or the like.

In the case of forming a nitride semiconductor on a base body by selective growth using a mask, an anti-surfactant film having an opening is formed on the base body. The anti-surfactant film may be a silicon oxide film, a silicon nitride film or the like, which has a function of preventing deposition of a nitride semiconductor on a region, covered with a non-opened portion of the anti-surfactant film, of the base body. The surface of the base body is exposed from the bottom of the opening portion formed in the anti-surfactant film, and crystal growth proceeds from the surface of the base body via the opening portion of the anti-surfactant film. The opening portion is formed by a photolithography technique. The shape of the opening portion is not particularly limited but may be as a polygonal shape, such as stripe shape, circular shape, and hexagonal shape. For example, by forming an opening portion having a circular shape of a size of about 10 μm or having a hexagonal shape which has a side extending in a <1–100> direction or a <11–20> direction and which has a size of about 10 μm, it is possible to simply form a selective growth layer having a region of a size being about twice the size of the opening portion. In this case, if the selective growth layer has S-planes extending in a direction different from a principal plane of a substrate, it is possible to obtain an effect of bending and cutting off dislocations propagating from the principal plane of the substrate, and hence to reduce the density of dislocations.

In an embodiment nitride semiconductor layer is selectively grown from the opening portion thus formed in the anti-surfactant film on the base body. The nitride semiconductor layer is preferably made from a semiconductor material having a wurtzite type crystal structure. Such a semiconductor material can be a group III based compound semiconductor, a BeMgZnCdS based compound semiconductor or the like. Examples of the group III based compound semiconductors can include a gallium nitride (GaN) based compound semiconductor, an aluminum nitride (AlN) based compound semiconductor, an indium nitride (InN) based compound semiconductor, an indium gallium nitride (InGaN) based compound semiconductor, an aluminum gallium nitride (AlGaN) based compound semiconductor or the like. In particular, a preferred nitride semiconductor is a gallium nitride based compound semiconductor. It is to be noted that, in the present invention, InGaN, AlGaN, GaN or the like does not necessarily mean a nitride semiconductor having only a strict ternary or binary mixed crystal structure. For example, InGaN can contain an impurity, such as a trace of Al, in a range not changing the function of InGaN without departing from the scope of the present invention.

The above-described crystal layer, that is, the nitride semiconductor layer may be grown by one of a variety of vapor phase growth processes, for example, a metal organic chemical vapor deposition (MOCVD) (which is also called a metal organic vapor phase epitaxial growth (MOVPE) process), a molecular beam epitaxial growth (MBE) process, a hydride vapor phase epitaxial growth (HVPE) process or the like. In an embodiment, the MOVPE process can be used in growing the nitride semiconductor layer with good crystallinity at a high crystal growth rate. In the MOVPE process, alkyl metal compounds are often used as Ga, Al and In sources. For example, TMG (trimethyl gallium) or TEG (triethyl gallium) is used as the Ga source, TMA (trimethyl aluminum) or TEA (triethyl aluminum) is used as the Al source, and TMI (trimethyl indium) or TEI (triethyl indium) is used as the In source. In the MOVPE process, a gas, such as ammonia, hydradine or the like, is used as a nitrogen source; and silane gas is used as an Si (impurity) source, germanium gas is used as a Ge (impurity) source, cyclopentadienyl magnesium is used as a Mg (impurity) source, and a DEZ (diethyl zinc) gas is used as a Zn (impurity) source. According to the MOCVD process, for example, an InAlGaN based compound semiconductor layer can be formed on a substrate by epitaxial growth by supplying the above gases to the surface of the substrate heated, for example, at 600° C. or more, to decompose the gases.

The above-described selective growth typically allows formation of the nitride semiconductor layer having a facet structure. For example, if the principal plane of the base body or the substrate has a (C+)-plane, the S-planes can be stably formed as tilted or slanted crystal planes of the nitride semiconductor layer with respect to the principal plane. The S-plane is a stable plane which is relatively easily, selectively grown on the (C+)-plane. It is to be noted that the S-plane is expressed by a (1–101) plane in Millar indices for the hexagonal system. The (C+)-plane and (C−)-plane are present as the C-plane, and similarly, the (S+)-plane and (S−)-plane are present as the S-plane. According to an embodiment of the present invention, unless otherwise specified, the (S+)-plane, which is grown on the (C+)-plane of the GaN layer, is taken as the S-plane. The (S+)-plane is stable more than the (S−)-plane. In addition, the (C+)-plane is expressed by a (0001) plane in Millar indices. In the case of forming the nitride semiconductor layer made from the above-described gallium nitride based compound semiconductor, the number of bonds of gallium (Ga) on the S-plane, which bonds are bonded to nitrogen (N), is two or three. The number of bonds of Ga to N on the S-plane is smaller than the number of bonds of Ga to N on the (C−)-plane but is larger than the number of bonds of Ga to N on any other crystal plane. Here, since the (C−)-plane cannot be actually formed on the (C+)-plane, the number of bonds of Ga to N on the S-plane is largest. For example, in the case of growing a wurtzite type nitride on a sapphire substrate with the (C+)-plane taken as the principal plane, a surface of the nitride generally becomes the (C+)-plane; however, the S-plane of the nitride can be formed by using selective growth. Nitrogen (N) is liable to be eliminated on a plane parallel to the C-plane, and therefore, N is bonded to Ga by means of only one bond of Ga. On the other hand, on the tilted S-plane, N is bonded to Ga by means of at least one or more bonds of Ga. As a result, a V/III ratio of a crystal layer selectively grown on the S-plane is effectively increased, to improve the crystallinity of the stacked structure selectively grown on the S-plane. Also, in the case of growing a crystal layer along a direction different from the orientation of the principal plane of a substrate, since dislocations propagating upwardly from the substrate are bent, it is possible to reduce occurrence of crystal defects. Further, in selective growth using a selective growth mask having a window (opening portion), a crystal layer can be laterally grown from the window to be formed into a shape larger than a window region. It is known that such lateral growth using micro-channel epitaxy is effective to prevent occurrence of through-dislocations and hence to reduce the density of dislocations. The lateral growth also makes it possible to increase a light emission region, equalize a current, prevent concentration of current, and reduce a current density.

The nitride semiconductor layer formed by the above-described selective growth has a facet structure having the S-planes or planes being substantially equivalent to the S-planes. The facet structure is typically grown such that an area of a plane, being in parallel to the principal plane of the base body, of the facet structure becomes gradually small along with selective growth. To be more specific, since the nitride semiconductor layer is grown into a pyramid shape having tilt planes, a plane, being in parallel to the principal plane of the base body, of the pyramid shaped nitride semiconductor layer becomes gradually small as nearing a top portion thereof. The top portion means a peak portion at which the tilt planes cross each other, a region forming a ridge line raised from a stripe-shaped opening portion, and a highest region if the nitride semiconductor layer is formed into a hexagonal shape.

According to a vapor-phase growth method for a nitride semiconductor of an embodiment of the present invention, an area of a plane, being nearly in parallel to a principal plane of the base body, of the nitride semiconductor layer grown along the plane by selective growth can vary with respect to time $S(t)$ (t: time), where an area $S(t2)$ of the nitride semiconductor layer at a time t2 is equal to or smaller than an area $S(t1)$ of the nitride semiconductor layer at a time t1 before the time t2, and a source supplied amount X2 or a crystal growth rate V2 at the time t2 is equal to or smaller than a source supplied amount X1 or a crystal growth rate V1 at the time t1. In other words, when an area of a nitride semiconductor layer, such as a gallium nitride layer, becomes small after an elapsed time period during selective growth, the crystal growth condition is controlled such that a source supplied amount or a crystal growth rate is correspondingly reduced. With such a control, it is possible to relieve a state in which the source supplied amount becomes excessive in the vicinity of the top portion of the nitride semiconductor layer, and hence to desirably keep crystallinity of a portion, in the vicinity of the top portion, of the nitride semiconductor layer. Each of the source supplied amounts X1 and X2 is a supplied amount of a source gas of a group III element, for example, an alkyl metal compound, such as TMG (trimethyl gallium) or TEG (triethyl gallium) used as a Ga source, TMA (trimethyl aluminum) or TEA (triethyl aluminum) used as an Al source, or TMI (trimethyl indium) or TEI (triethyl indium) used as an In source or the like or combinations thereof.

FIG. 1 shows a relationship, obtained in the case of forming a nitride semiconductor layer by selective growth, among a time t, an area S of the nitride semiconductor layer, and a source supplied amount X to be controlled. As shown in this figure, the area S of the nitride semiconductor layer is S1 at a time t1, and is S2 smaller than S1 at a time t2 after an elapse of a specific period of time since the time t1. It is to be noted that the area S of the nitride semiconductor layer is an area defined by a plane, being in parallel to a principal plane of a base body or a substrate, of the nitride semiconductor layer, which plane tends to become gradually small along with selective growth. In the relationship shown in FIG. 1, the area S is converged while depicting a quadratic curve with an elapse of the time t. In one example of the vapor-phase growth method of a nitride semiconductor of an embodiment of the present invention, the source supplied amount X is changed with respect to a change in the area S. That is to say, at the time t1, since the area S1 is large, the supplied amount X1 of, for example, trimethyl gallium is set to a large value, while at the time t2 after an elapse of a specific period of time since the time t1, since the area S2 is smaller than the area S1, the supplied amount X2 of, for example, trimethyl gallium is set to a value smaller than the source supplied amount X1.

In the relationship shown in FIG. 1, a change curve C1 of the source supplied amount is changed while depicting a quadratic curve, and the source supplied amount X is controlled to be changed, for example, as a quadratic function of time; however, the present invention is not limited thereto, but may be configured such that the source supplied amount X be controlled to be changed linearly, for example, changed while depicting a straight line C2 shown in FIG. 1, or changed exponentially or stepwise. In addition, while the source supplied amount is, generally, continuously controlled so as to be continuously lowered, it may be discontinuously controlled so as to be discontinuously lowered.

Figure 2:
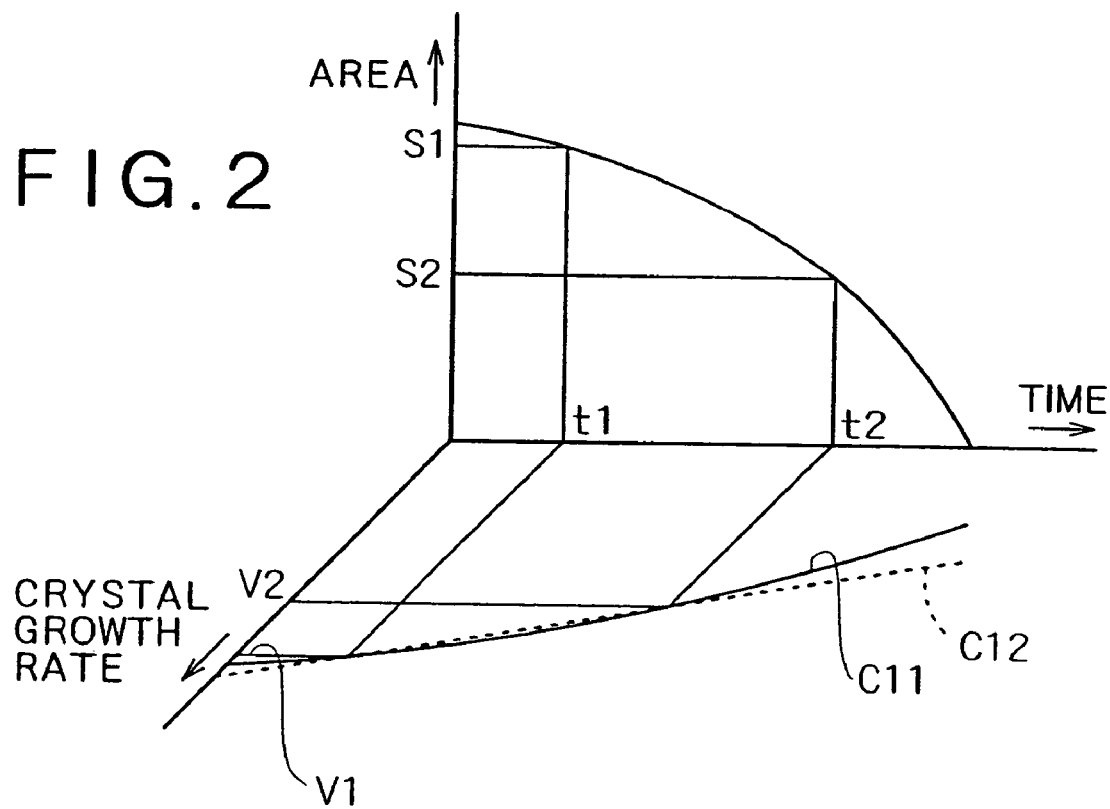
FIG. 2 is a graph showing a relationship among a time t, an area S of a nitride semiconductor layer, and a crystal growth rate V to be controlled, wherein the nitride semiconductor layer is formed by selective growth by a vapor-phase growth method for a nitride semiconductor according to an embodiment of the present invention.

FIG. 2 shows a relationship, obtained in the case of forming a nitride semiconductor layer by selective growth, among a time t, an area S of the nitride semiconductor layer, and a crystal growth rate V to be controlled. According to the vapor-phase growth method for a nitride semiconductor shown in FIG. 1, the source supplied amount X is changed depending on a change in the area S of the nitride semiconductor layer, while according to the vapor-phase growth method for a nitride semiconductor shown in FIG. 2, the crystal growth rate V is changed depending on a change in the area S of the nitride semiconductor layer. Like the vapor-phase growth method for a nitride semiconductor shown in FIG. 1, at a time t1, since an area S1 is large, a crystal growth rate V1 is large, while at a time t2 after an elapse of a specific period of time since the time t1, since an area S2 is smaller than the area S1, a crystal growth rate V2 is set to be smaller than the crystal growth rate V1.

In the relationship shown in FIG. 2, a change curve C11 of the crystal growth rate V is changed while depicting a quadratic curve, and like the crystal growth method for a nitride semiconductor shown in FIG. 1, the crystal growth rate V is controlled to be changed, for example, as a quadratic function of time; however, the present invention is not limited thereto, but may be configured such that the crystal growth rate V be controlled to be changed linearly, for example, changed while depicting a straight line C12 shown in FIG. 2, or changed exponentially, stepwise or the like. In addition, while the crystal growth rate is, generally, continuously controlled so as to be continuously lowered, it may be discontinuously controlled so as to be discontinuously lowered.

According to an embodiment of the present invention, control of a crystal growth temperature of a nitride semiconductor layer can be added to the above-described control of the source supplied amount shown in FIG. 1 and/or the above-described control of the crystal growth rate shown in FIG. 2. It this case, the control of the source supplied amount and/or crystal growth temperature can be contributed to the control of the crystal growth rate. In other words, the crystal growth rate can be determined depending on the control of the source supplied amount and/or crystal growth temperature.

In the vapor-phase growth method for a nitride semiconductor according to an embodiment of the present invention, the changed amount (X1/X2) of the source supplied amount X or the changed amount (V1/V2) of the crystal growth rate V may be in a range of about 0.1 time to about 30 times, preferably, in a range of about 0.3 time to about 10 times, depending on the area ratio (S1/S2). If the changed amount X1/X2 or V1/V2 is smaller than about 0.1 time, the crystal growth rate can be excessively low, thereby causing a problem that the nitride semiconductor cannot be sufficiently grown. If the changed amount X1/X2 or V1/V2 is larger than about 30 times, the source supplied amount or the crystal growth rate at the top portion of the nitride semiconductor layer can become excessively large, thereby causing a problem that crystallinity of the nitride semiconductor layer is degraded.

The crystal growth method for a nitride semiconductor according to an embodiment of the present invention is particularly effective in the case of growing a mixed crystal containing indium (In) as a nitride semiconductor layer or growing a mixed crystal layer containing In on a nitride semiconductor layer formed by selective growth. A mixed crystal containing In has a property that the composition thereof, the uniformity of the composition, and the crystallinity (crystal defect such as nitride vacancies) are particularly sensitive to the crystal growth rate of the mixed crystal, and therefore, a mixed crystal layer containing in with good crystallinity can be formed by control of the crystal growth condition according to an embodiment of the present invention. Further, since the composition of a mixed crystal, the uniformity of the composition, and the crystallinity (crystal defect such as nitride vacancies) are also sensitive to crystallinity of an underlying layer, a mixed crystal layer containing In with good crystallinity can be formed by forming a nitride semiconductor layer as the underlying layer under the control of the crystal growth condition according to an embodiment of the present invention, and forming the mixed crystal layer containing In thereon.

As one example of the vapor-phase method for a nitride semiconductor according to an embodiment of the present invention, a nitride semiconductor containing In may be formed by selective vapor-phase growth such that a crystal growth rate in the direction perpendicular to a principal plane of a base body is maintained at about 1 μm/h or less. In the case of forming the nitride semiconductor layer containing In by selective growth, preferable low rate growth can be realized by setting the crystal growth rate in the direction perpendicular to the principal plane of the base body to about 1 μm/h or less. This provides a desirable crystalline structure that is not degraded, particularly with respect to the top portion of the nitride semiconductor layer.

By way of example, and not limitation, the vapor-phase growth method for a nitride semiconductor according to an embodiment of the present invention will be more fully described with reference to first, second, and third examples. In the first example shown in FIGS. 3 to 6, the present invention is applied to selective growth using a stripe-type mask that has a rectangular shape. In the second example shown in FIGS. 7 to 10, the present invention is applied to selective growth using a hexagonal-shaped mask. In the third example shown in FIG. 11, the present invention is applied to a semiconductor laser having an InGaN layer on a C-plane.

FIRST EXAMPLE

Figure 3:
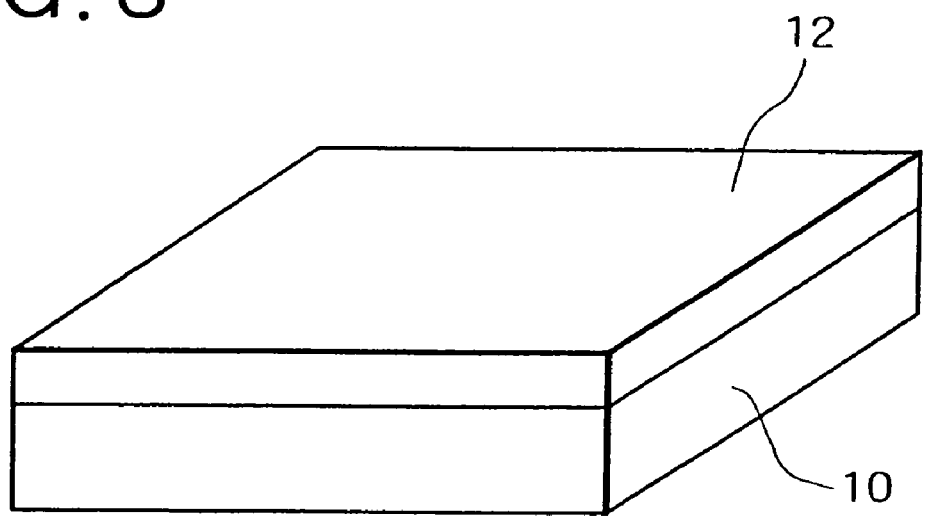
FIG. 3 is a perspective sectional view illustrating a step of a vapor-phase growth method for a nitride semiconductor according to an embodiment of the present invention, particularly, showing a state where a GaN layer has been formed on a substrate.

In an embodiment, the vapor-phase growth method for a nitride semiconductor according to the present invention is applied to selective growth using a stripe-shaped mask. Referring to FIG. 3, a sapphire substrate 10 with a C-plane of sapphire taken as a principal plane having a size of about 2 inches is placed in an organometallic vapor-phase growth apparatus (not shown). A carrier gas such as a mixed gas of $H_2$ and $N_2$ is made to flow in a reaction chamber of the growth apparatus, and in the flow of this carrier gas, the sapphire substrate 10 is heat-treated at 1050° C. for 20 min, so that the surface of the sapphire substrate is thermally cleaned. The substrate temperature is then lowered to, for example, 510° C. and then ammonia ($NH_3$) as an N source and trimethyl gallium ($Ga(CH_3)_3$) as a Ga source are supplied in the reaction chamber, to grow a GaN buffer layer on the principal plane (C-plane of sapphire) of the sapphire substrate 10. The GaN buffer layer may be an AlN buffer layer. After such a low temperature buffer layer is formed, a GaN layer 12 composed of an undoped GaN layer and an Si-doped n-type GaN layer is grown, at about 1000° C., to a thickness of about 2 μm. In this growth, silane gas is used as a silicon source.

Figure 4:
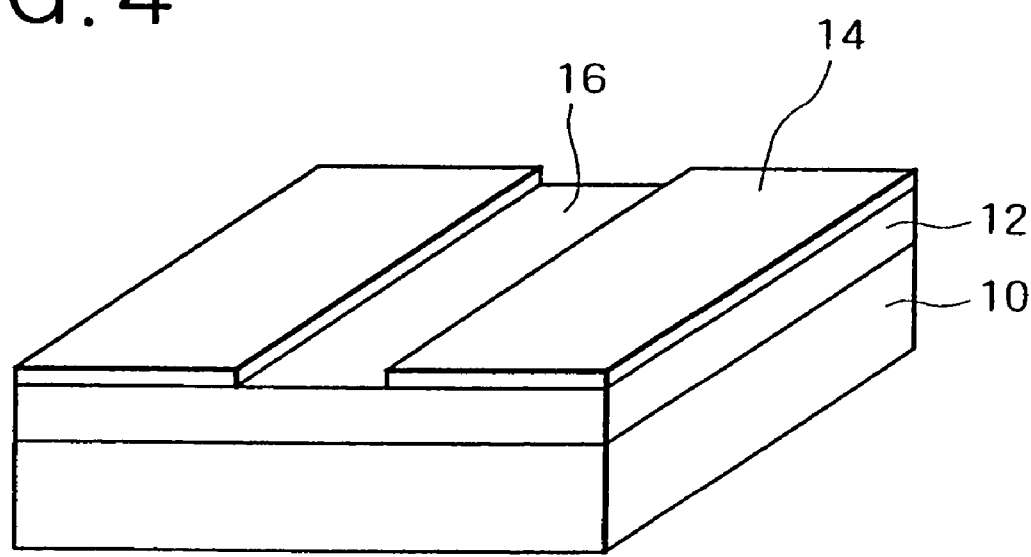
FIG. 4 is a perspective sectional view illustrating a step, continued from that shown in FIG. 3, of the vapor-phase growth according to an embodiment of the present invention, particularly, showing a state that an opening portion has been formed in an oxide film formed on the GaN layer.

After the GaN layer 12 is formed, a silicon oxide film 14 as an anti-surfactant film is formed on the overall surface of the GaN layer 12. Referring to FIG. 4, part of the silicon oxide film 14 is opened into a stripe-shape, to form an opening portion 16. An opening width of the opening portion 16 is set to, for example, about 8 μm. A region, excluding the opening portion 16, of the GaN layer 12 is covered with the silicon oxide film 14 as the anti-surfactant film. The stripe-shaped opening portion 16 is formed by photolithography.

Figure 5:
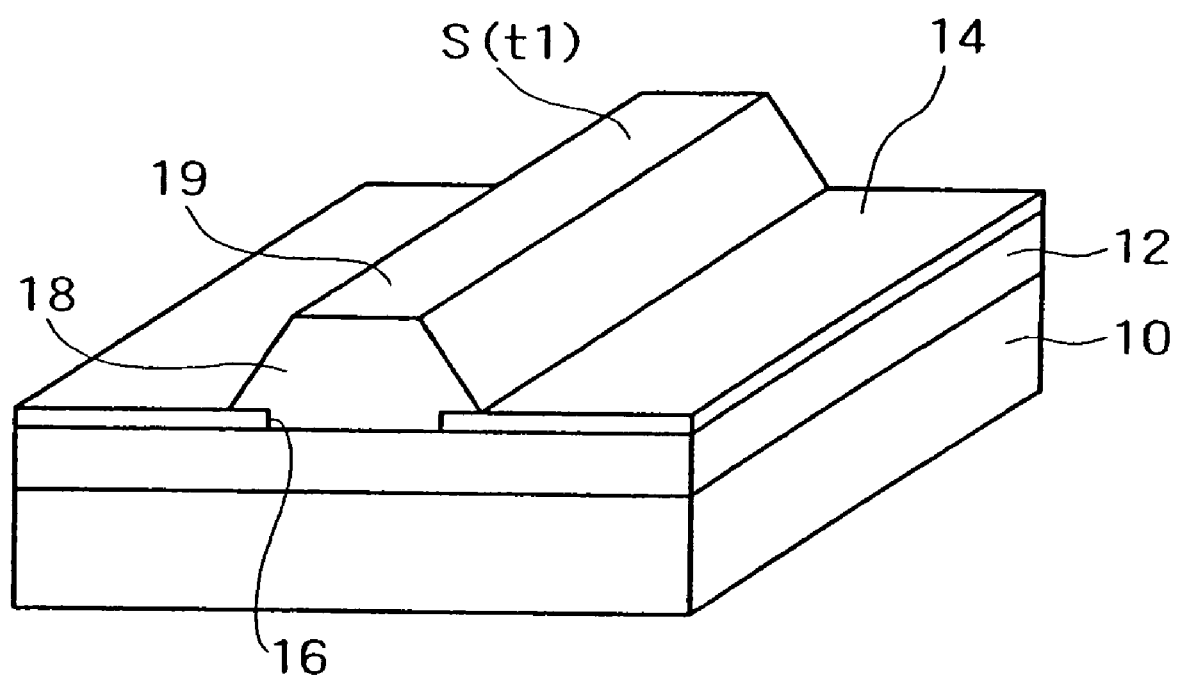
FIG. 5 is a perspective sectional view showing a step, continued from that shown in FIG. 4, of the vapor-phase growth according to an embodiment of the present invention, particularly, showing a state that a GaN layer has been selectively grown until a time (t1) after a short period of time from the start of growth.
Figure 6:
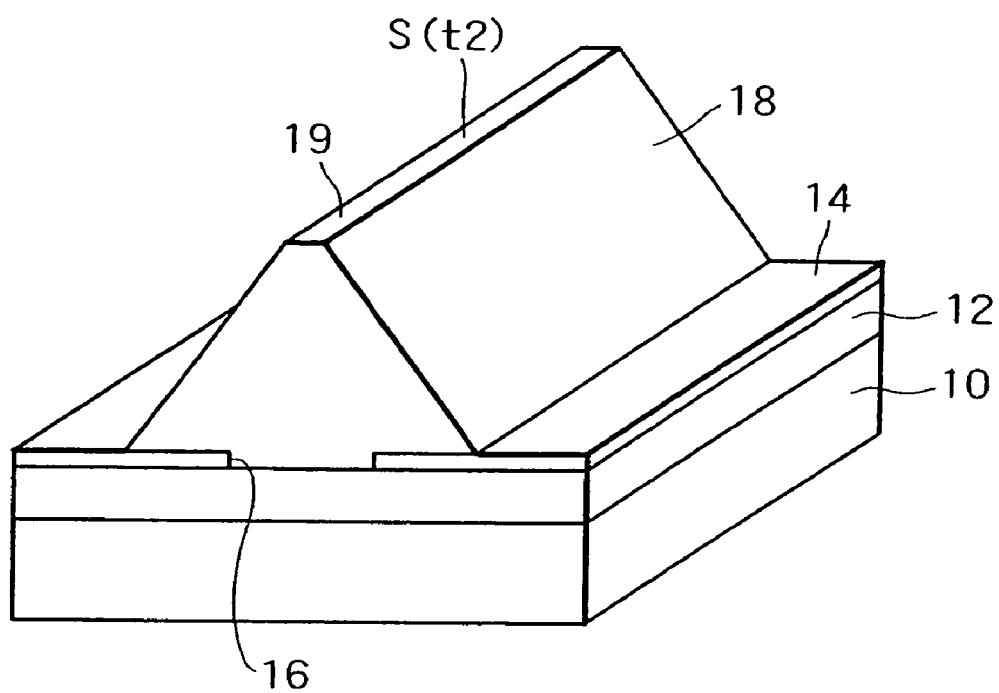
FIG. 6 is a perspective sectional view showing a step, continued from that shown in FIG. 5, of the vapor-phase growth according to an embodiment of the present invention, particularly, showing a state that the GaN layer has been further selectively grown up to the vicinity of a top portion until a time (t2).
Figure 7:
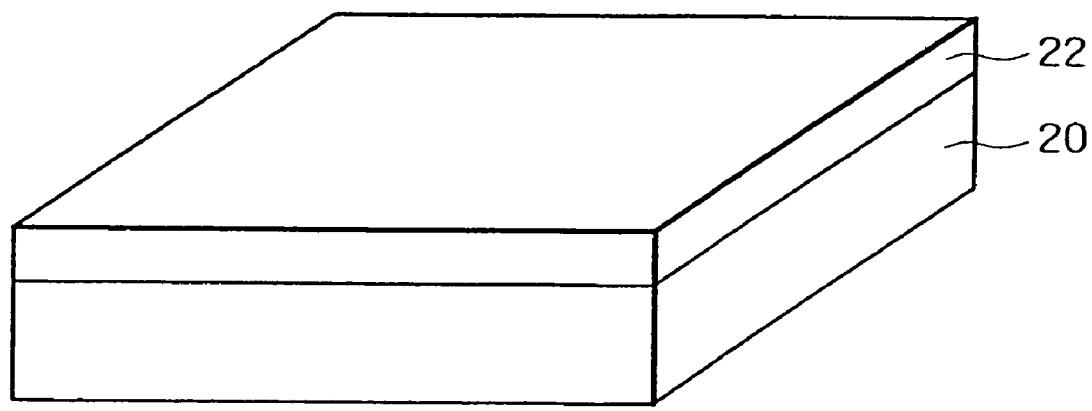
FIG. 7 is a perspective sectional view illustrating a step of a vapor-phase growth according to an embodiment of the present invention, particularly, showing a state that a GaN layer has been formed on a substrate.

The sapphire substrate 10 is again put in the organometallic vapor-phase growth apparatus. Referring to FIG. 5, the substrate temperature is raised to about 1200° C., and a carrier gas, such as a mixed gas of $H_2$ and $N_2$, is made to flow in the reaction chamber and ammonia ($NH_3$) as the N source and trimethyl gallium ($Ga(CH_3)_3$) as the Ga source are supplied in the reaction chamber, to form a GaN layer 18 by selective growth. The GaN layer 18 having tilt planes (S-planes) is selectively grown from the opening portion 16 in the direction perpendicular to the principal plane of the substrate. The tilt planes (S-planes) of the GaN layer 18 grow in such a manner as to be protruded outside the opening portion 16 and to be tilted along the opening portion 16. During selective growth of the GaN layer 18, a region, sandwiched between the S-planes, of the GaN layer 18 forms an upper plane 19 parallel to the principal plane of the substrate. At a certain time in the beginning stage of selective growth, a width of the upper plane 19 is taken as about 6 μm. At this time, a supplied amount of trimethyl gallium (TMGa) as the source gas of Ga (group III element) is set to about 60 μmol/min.

Along with such selective growth, a height of the GaN layer 18, which is being selectively grown, becomes gradually large, and the width of the upper plane 19 becomes small. When the width of the upper plane 19 becomes about 2 μm, the supplied amount of trimethyl gallium (TMGa) as the source gas of Ga (group III element) is reduced to about 20 μmol/min. With respect to the supplied amount of trimethyl gallium, according to the related art method, since the supplied amount of trimethyl gallium is usually set to about 60 μmol/min during selective growth, crystallinity of a GaN layer at the top portion is degraded. On the contrary, according to an embodiment of the present invention, since the supplied amount of trimethyl gallium is reduced to about 20 μmol/min, good crystallinity of the GaN layer 18 at the portion whose upper plane is about 2 μm can be obtained.

After the GaN layer 18 is formed while the supplied amount of trimethyl gallium is reduced when the selectively growing portion of the GaN layer 18 is close to the vicinity of the top portion thereof, the supply of trimethyl gallium is once stopped. Subsequently, the carrier gas is all changed into nitrogen gas while the crystal growth temperature is dropped to about 730° C., and trimethyl gallium as the Ga source gas and trimethyl indium as an In source are supplied, to stack an InGaN active layer made from InGaN to a thickness of 30 angstroms (Å) on the GaN layer 18. After the InGaN active layer is formed, the substrate temperature is raised while trimethyl gallium as the Ga source gas and methylcyclopentadienyl magnesium as an Mg source are supplied, to form a magnesium-doped p-type GaN layer. Annealing is then performed in nitrogen gas at about 800° C., and an n-side electrode made from Ti/Al, and a p-side electrode made from Ni/Pt/Au are formed. A semiconductor light emitting diode is thus produced.

According to an embodiment, when the width of the upper plane 19 of the GaN layer 18 which has selectively grown at the crystal growth rate of about 60 μmol/min, that is, when the area S(t) of the GaN layer 18 becomes small, the supplied amount of trimethyl gallium (TMGa) as the source gas of Ga (group III element) is reduced to about 20 μmol/min. As a result, it is possible to prevent the supply of the source gas from becoming excessively large in the vicinity of the top portion of the GaN layer 18, and hence to obtain good crystallinity in the vicinity of the top portion of the GaN layer 18.

SECOND EXAMPLE

In an embodiment, the vapor-phase growth method for a nitride semiconductor according to the present invention is applied to selective growth using a hexagonal-shaped mask. The method according to this embodiment will be described in the order of steps shown in FIGS. 7 to 10. Like the first example, a sapphire substrate 20 with a C-plane of sapphire taken as a principal plane having a size of about 2 inches is put in an organometallic vapor-phase growth apparatus (not shown), and the surface of the sapphire substrate 20 is thermally cleaned, and then ammonia ($NH_3$) as an N source and trimethyl gallium ($Ga(CH_3)_3$) as a Ga source are supplied in the reaction chamber, to grow a GaN buffer layer on the principal plane (C-plane of sapphire) of the sapphire substrate 20. The GaN buffer layer may be an AlN buffer layer. After such a low temperature buffer layer is formed, a GaN layer 22 composed of an undoped GaN layer and an Si-doped n-type GaN layer is grown, at about 1000° C., to a thickness of about 2 μm. In this growth, silane gas is used as a silicon source.

Figure 8:
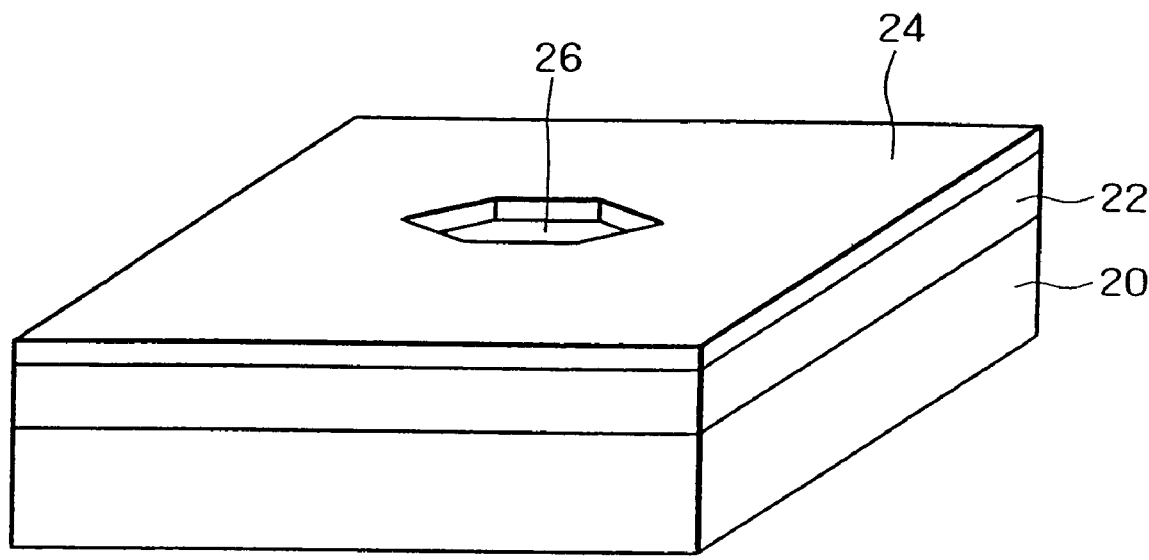
FIG. 8 is a perspective sectional view illustrating a step, continued from that shown in FIG. 7, of the vapor-phase growth according to an embodiment of the present invention, particularly, showing a state that an opening portion has been formed in an oxide film formed on the GaN layer.

After the GaN layer 22 is formed, a silicon oxide film 24 as an anti-surfactant film is formed on the overall surface of the GaN layer 22. Referring to FIG. 8, part of the silicon oxide film 24 is opened into a hexagonal-shape, to form an opening portion 26. An opening width of the opening portion 26 is set to, for example, about 8 μm. A region, excluding the opening portion 26, of the GaN layer 22 is covered with the silicon oxide film 24 as the anti-surfactant film. The hexagonal-shaped opening portion 26 is formed by photolithography.

Figure 9:
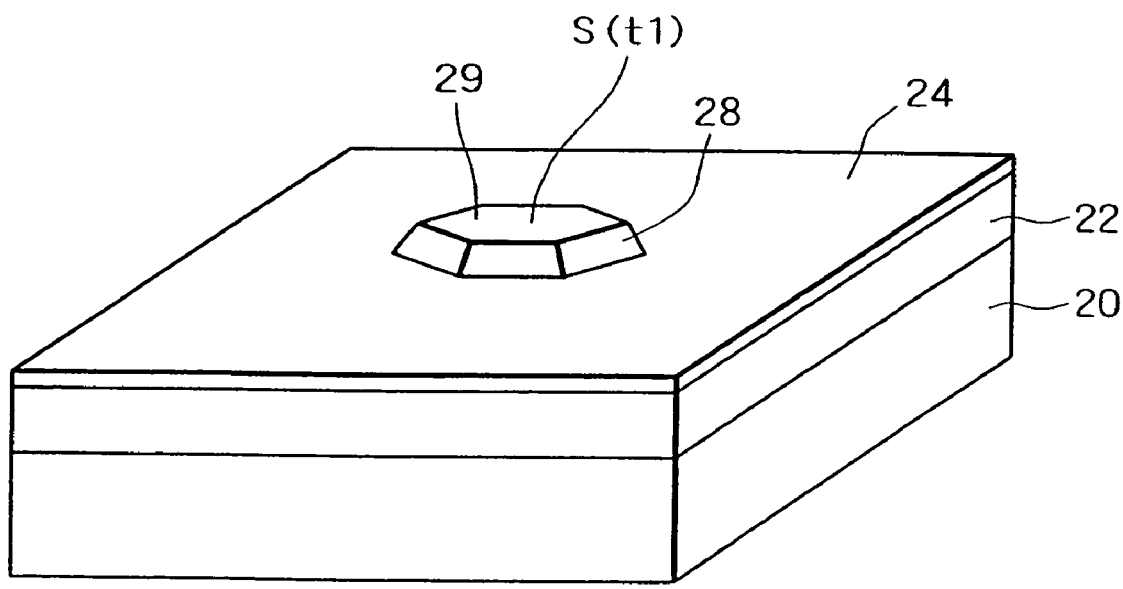
FIG. 9 is a perspective sectional view showing a step, continued from that shown in FIG. 8, of the vapor-phase growth method for a nitride semiconductor according to an embodiment of the present invention, particularly, showing a state that a GaN layer has been selectively grown until a time (t1) after a short period of time from the start of growth.
Figure 10:
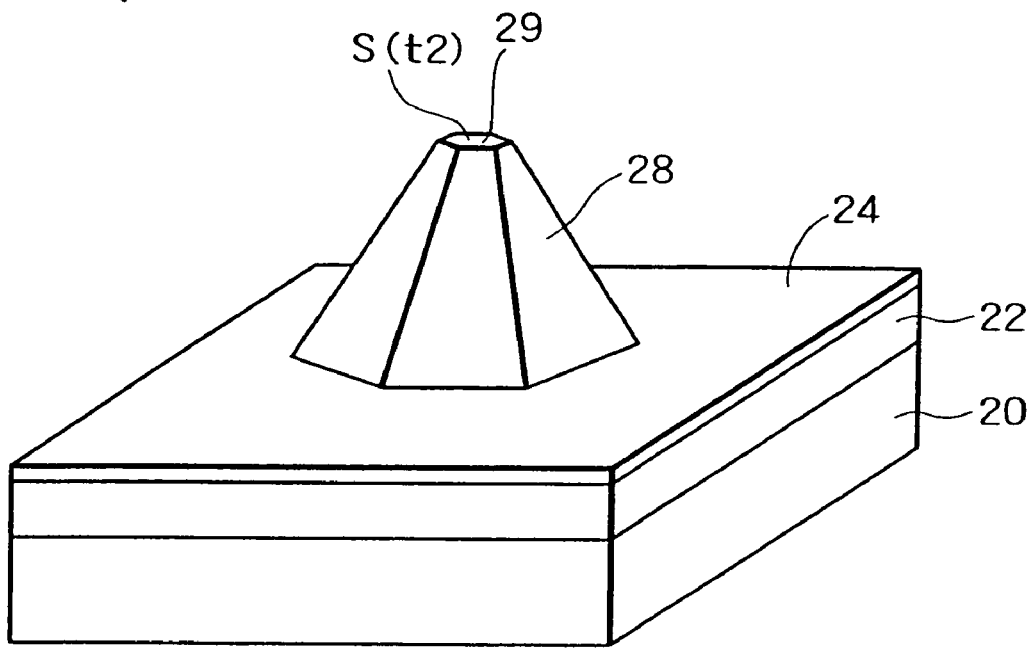
FIG. 10 is a perspective sectional view showing a step, continued from that shown in FIG. 9, of the vapor-phase growth according to an embodiment of the present invention, particularly, showing a state that the GaN layer has been further selectively grown up to the vicinity of a top portion until a time (t2).

The sapphire substrate 20 is again put in the organometallic vapor-phase growth apparatus. Referring to FIG. 9, the substrate temperature is raised to about 1200° C., and a carrier gas, such as a mixed gas of $H_2$ and $N_2$, is made to flow in the reaction chamber and ammonia ($NH_3$) as the N source and trimethyl gallium ($Ga(CH_3)_3$) as the Ga source are supplied in the reaction chamber, to form a GaN layer 28 by selective growth. The GaN layer 28 having tilt planes (S-planes) is selectively grown from the opening portion 26 in the direction perpendicular to the principal plane of the substrate. The tilt planes (S-planes) of the GaN layer 28 grow in such a manner as to be protruded outside the opening portion 26 and to be tilted along the hexagonal opening portion 26. During selective growth of the GaN layer 28, a region, sandwiched between the S-planes, of the GaN layer 28 forms an upper plane 29 parallel to the principal plane of the substrate. At a certain time in the beginning stage of selective growth, a width of the upper plane 29 is taken as about 7 μm. At this time, a supplied amount of trimethyl gallium (TMGa) as the source gas of Ga (group III element) is set to about 60 μmol/min.

Along with such selective growth, a height of the GaN layer 28, which is being selectively grown, becomes gradually large, and the width of the upper plane 29 becomes small. When the width of the upper plane 29 becomes about 2 μm, the supplied amount of trimethyl gallium (TMGa) as the source gas of Ga (group III element) is reduced to about 15 μmol/min. With respect to the supplied amount of trimethyl gallium, according to the related art method, since the supplied amount of trimethyl gallium is usually set to about 60 μmol/min during selective growth, crystallinity of a GaN layer at the top portion is degraded. On the contrary, according to an embodiment of the prevent invention, since the supplied amount of trimethyl gallium is reduced to about 15 μmol/min, good crystallinity of the GaN layer 28 at the portion whose upper plane is 2 μm can be obtained.

After the GaN layer 28 is formed while the supplied amount of trimethyl gallium is reduced when the selectively growing portion of the GaN layer 28 is close to the vicinity of the top portion thereof, the supply of trimethyl gallium is once stopped. Subsequently, the carrier gas is all changed into nitrogen gas while the crystal growth temperature is dropped to about 730° C., and trimethyl gallium as the Ga source gas and trimethyl indium as an In source are supplied, to stack an InGaN active layer made from InGaN to a thickness of 30 Å on the GaN layer 28. After the InGaN active layer is formed, the substrate temperature is raised while trimethyl gallium as the Ga source gas and methylcyclopentadienyl magnesium as an Mg source are supplied, to form a magnesium-doped p-type GaN layer. Annealing is then performed in nitrogen gas at about 800° C., and an n-side electrode made from Ti/Al, and a p-side electrode made from Ni/Pt/Au are formed. A semiconductor light emitting diode is thus produced.

According to an embodiment of the present invention, when the width of the upper plane 29 of the GaN layer 28 which has selectively grown at the crystal growth rate of about 60 μmol/min, that is, when the area S(t) of the GaN layer 28 becomes small, the supplied amount of trimethyl gallium (TMGa) as the source gas of Ga (group III element) is reduced to about 15 μmol/min. As a result, it is possible to prevent the supply of the source gas from becoming excessively large in the vicinity of the top portion of the GaN layer 28, and hence to obtain good crystallinity in the vicinity of the top portion of the GaN layer 28.

THIRD EXAMPLE

Figure 11:
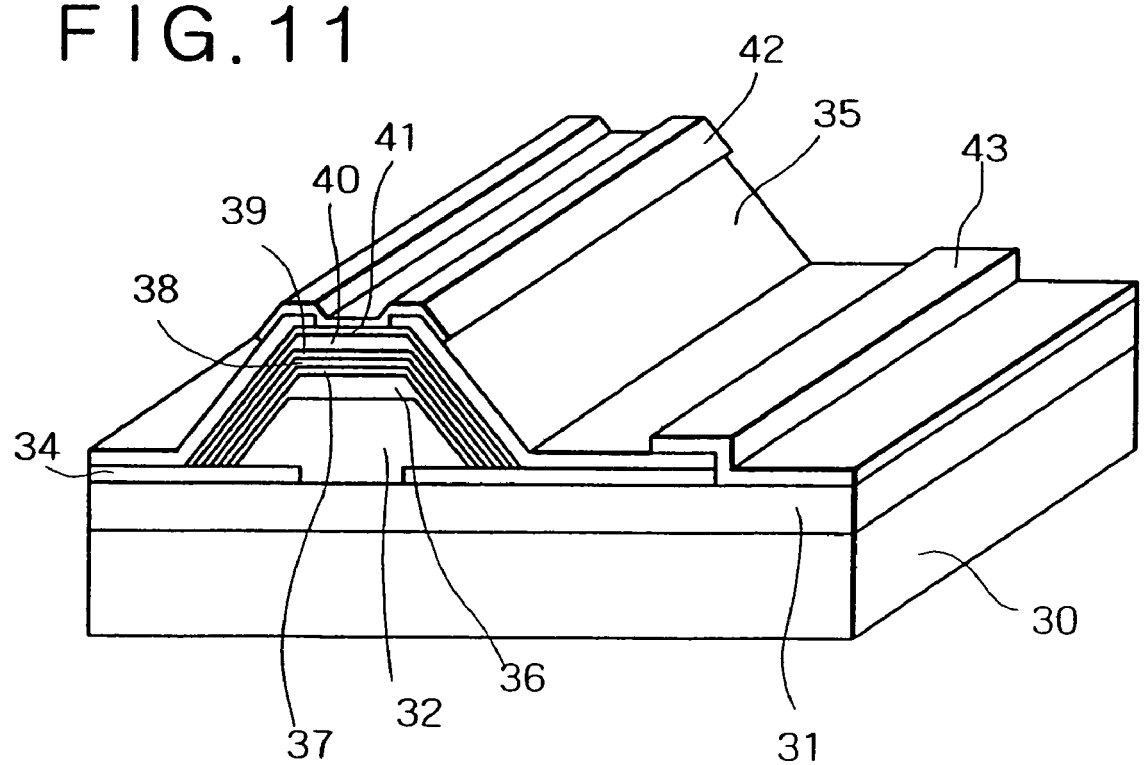
FIG. 11 is a perspective sectional view showing a structure of a semiconductor laser according to an embodiment of the present invention, wherein an active layer having a multi-quantum well (MQW) structure of InGaN/GaN is formed on a C-plane of a nitride semiconductor layer.

In an embodiment, the present invention is applied to a semiconductor laser configured such that a multi-quantum well (MQW) type active layer made from InGaN/GaN is formed on a C-plane of a nitride semiconductor as shown in FIG. 11. Like the first example, after a sapphire substrate 30 with a C-plane of sapphire taken as a principal plane is thermally cleaned at about 1050° C. for example, a GaN buffer layer or an Aln buffer layer is grown, for example, at about 510° C. After such a GaN buffer layer is formed, a crystal growth temperature is raised to about 1020° C., and an undoped GaN layer (not shown) is formed and then an Si-doped n-type GaN layer 31 is grown to a thickness of about 2 μm. In this growth, silane gas is used as a silicon source.

After the silicon-doped GaN layer 31 is formed, a silicon oxide film 34 as an anti-surfactant film is formed on the overall surface of the GaN layer 31. Part of the silicon oxide film 34 is opened into a stripe-shape, to form an opening portion. An opening width of the opening portion is set to, for example, about 8 μm. A region, excluding the opening portion, of the GaN layer 31 is covered with the silicon oxide film 34 as the anti-surfactant film. The stripe-shaped opening portion is formed by photolithography. After the stripe-shaped opening is formed, the sapphire substrate 30 is again put in the organometallic vapor-phase growth apparatus. The substrate temperature is raised to about 1020° C., and a carrier gas such as a mixed gas of $H_2$ and $N_2$ is made to flow in the reaction chamber and ammonia ($NH_3$) as the N source and trimethyl gallium ($Ga(CH_3)_3$) as the Ga source are supplied in the reaction chamber, to form a GaN layer 32 by selective growth. At this time, the supplied amount of trimethyl gallium is set to about 60 μmol/min. The GaN layer 32, which has tilt planes (S-planes), is selectively grown from the opening portion in the direction perpendicular to the principal plane of the substrate. The tilt planes (S-planes) of the GaN layer 32 grow in such a manner as to be protruded outside the opening portion and to be tilted along the opening portion. During selective growth of the GaN layer 32, when a width of an upper plane of the GaN layer 32 becomes about 2 μm, the supplied amount of trimethyl gallium (TMGa) as the source gas of Ga (group III element) is reduced to about 20 μmol/min. As a result, good crystallinity of the GaN layer 32 at the top portion can be obtained.

Subsequently, $NH_3$ as the N source, trimethyl gallium (TMGa, $Ga(CH_3)_3$) as the Ga source, and trimethyl aluminum (TMAl, $Al(CH_3)_3$) as an Al source are supplied in the reaction chamber, to grow an n-type AlGaN cladding layer 36. The supply of trimethyl gallium (TMGa) and trimethyl aluminum (TMAl) is stopped while the supply of $NH_3$ is continued, and trimethyl gallium (TMGa) is again supplied in the reaction chamber, to grow an n-type GaN guide layer 37.

Next, a state in which $NH_3$ as the N source, trimethyl gallium (TMGa) as the Ga source and trimethyl indium (TMIn) as an In source are supplied in the reaction chamber and a state in which the supply of trimethyl indium (TMIn) as the In source is stopped while the supply of trimethyl gallium (TMGa) as the Ga source is continued are repeated by about three times, to grow an active layer 38 having a multi-quantum well (MQW) structure composed of about three cycles of InGaN (30 Å)/GaN(50 Å). With respect to this MQW structure, the In content in the active layer 38 includes, for example, about 15%, and a crystal growth rate of the active layer 38 in a C-plane formation direction (in the direction perpendicular to the principal plane of the substrate) is maintained at about 0.2 μm/h. Such reduction of the crystal growth rate of the active layer 38 makes it possible to equalize a width of the quantum well structure of the active layer 38 and enhance crystallinity of the active layer 38, and hence to reduce the threshold value and improve the luminous efficiency.

After the active layer 38 having the multi-quantum well (MQW) structure is formed, the supply of $NH_3$ is continued and trimethyl gallium (TMGa) is again supplied in the reaction chamber, to grow a magnesium-doped p-type GaN guide layer 39. Further, $NH_3$ as the N source, trimethyl gallium (TMGa) as the Ga source and trimethyl aluminum (TMAl) as the Al source are supplied in the reaction chamber, to grow a p-type AlGaN cladding layer 40. Subsequently, trimethyl gallium (TMGa) as the Ga source and $NH_3$ as the N source are supplied while the supply of trimethyl aluminum (TMAl) is stopped, to grow a p-type GaN contact layer 41.

After the p-type GaN contact layer 41 is formed, a silicon oxide film 35 is formed. A groove is formed in the silicon oxide films 34 and 35 at a flat portion separated from the facet structure, to expose the surface of the n-type GaN layer 31 as the n-type nitride semiconductor layer, and an Al/Ti electrode 43 as an n-side electrode is formed on the exposed surface of the n-type GaN layer 31. On the other hand, a groove is formed in the silicon oxide film 35 at a top portion of the facet structure, to expose the surface of the p-type GaN contact layer 41, and an Ni/Pt/Au electrode 42 as a p-side electrode is formed on the exposed surface of the p-type GaN contact layer 41. A GaN based semiconductor laser is thus obtained.

In the GaN based semiconductor laser thus fabricated by the above-described method according to an embodiment of the present invention, since the supplied amount of trimethyl gallium (TMGa) as the source gas of Ga (group III element) is reduced when the area S(t) of the upper plane of the GaN layer 32 which is being selectively grown becomes small, it is possible to prevent the supply of the source gas from becoming excessively large in the vicinity of the top portion of the GaN layer 32 and hence to enhance the crystallinity of a portion, in the vicinity of the top portion, of the GaN layer 32. Further, since the crystal growth rate, in the C-plane formation direction, of the active layer 38 having the multi-quantum well (MQW) structure formed on the GaN layer having good crystallinity is reduced, the width of the quantum well structure of the active layer is equalized and the crystallinity thereof is enhanced, with a result that it is possible to reduce the threshold value and improve the luminous efficiency.

In each of the above-described embodiments, the present invention is applied to fabrication of the GaN based semiconductor light emitting device; however, the present invention is applicable to fabrication of a GaN based electron transit device such as a GaN based electric field effect transistor (FET). Further, in each of the above-described embodiments, in place of the GaN layer, there can be suitably used a nitride semiconductor such as $Al_xGa_{1-x}N$ layer.

As described above, the vapor-phase growth method for a nitride semiconductor according to an embodiment of the present invention can prevent the supply of a source of a group III element from becoming excessively large at a top portion of the nitride semiconductor layer, and hence to improve the crystallinity and flatness of the top portion of the nitride semiconductor layer and consequently improve characteristics of the device using the nitride semiconductor layer. In particular, in the case of fabricating a GaN based semiconductor light emitting device having a three-dimensional structure formed by selective growth according to an embodiment of the present invention, since the quality of an active layer is improved and a leak current resulting from irregularities of a top portion of the three-dimensional structure is reduced, it is possible to improve characteristics of the device.

It shall be understood that various changes and modifications to the presently preferred embodiments described herein will be apparent to those skilled in the art. Such changes and modifications can be made without departing from the spirit and scope of the present invention and without diminishing its intended advantages. It is therefore intended that such changes and modifications be covered by the appended claims.

The invention is claimed as follows:

1. A nitride semiconductor device comprising:
a base body having a principal plane;
a nitride semiconductor layer on the base body having a pyramid shape including a tilt plane, the tilt plane including an S-plane, wherein said nitride semiconductor layer having a first portion and a second portion formed on the base body by selective growth wherein the first portion is selectively grown with a first amount of source material over a first area along a plane substantially parallel to the principal plane of the base body during a first time period, wherein the second portion is selectively grown with a second amount of source material over a second area along the plane substantially parallel to the principal plane during a second time period, and wherein the second area is equal to or less than the first area and the second amount of source material is equal to or less than the first amount of source material; and
a p-side electrode formed on an upper portion of the nitride semiconductor layer, wherein an active layer is provided on the tilt plane of the nitride semiconductor layer, said tilt plane being not parallel to the principal plane of the base body.

2. A nitride semiconductor device according to claim 1, wherein the nitride semiconductor device has a structure selected from the group consisting of a light emitting device and an electron device.

3. A nitride semiconductor device according to claim 1, wherein the base body is at least one of a gallium nitride based compound semiconductor substrate and a gallium nitride based compound semiconductor layer grown on a substrate made from a material different than the gallium nitride based compound semiconductor layer.

4. A nitride semiconductor device according to claim 1, wherein the pyramid shape is a hexagonal pyramid.

5. A nitride semiconductor device comprising:
a base body having a principal plane;
a nitride semiconductor layer on the base body having a pyramid shape including a tilt plane, the tilt plane including an S-plane, wherein said nitride semiconductor layer having a first portion and a second portion formed on the base body by selective growth wherein the first portion is selectively grown at a first growth rate over a first area along a plane substantially parallel to the principal plane of the base body during a first time period, wherein the second portion is selectively grown at a second growth rate over a second area along the plane substantially parallel to the principal plane during a second time period, and wherein the second area is equal to or less than the first area and the second growth rate is equal to or less than the first growth rate; and
a p-side electrode formed on an upper portion of the nitride semiconductor layer, wherein an active layer is provided on the tilt plane of the nitride semiconductor layer, said tilt plane being not parallel to the principal plane of the base body.

6. A nitride semiconductor device according to claim 5, wherein the nitride semiconductor device has a structure selected from the group consisting of a light emitting device and an electron device.

7. A nitride semiconductor device according to claim 5, wherein the base body is at least one of a gallium nitride based compound semiconductor substrate and a gallium nitride based compound semiconductor layer grown on a substrate made from a material different from the gallium nitride based compound semiconductor layer.

8. A nitride semiconductor device according to claim 5, wherein the pyramid shape is a hexagonal pyramid.

* * * * *